United States Patent [19]

Hornung et al.

[11] Patent Number: 4,690,355
[45] Date of Patent: Sep. 1, 1987

[54] SOLAR ENERGY COLLECTOR

[75] Inventors: Ernst Hornung, Stuhr; Dietrich Rex, Brunswick, both of Fed. Rep. of Germany

[73] Assignee: ERNO Raumfahrttechnik Gmbh, Bremen, Fed. Rep. of Germany

[21] Appl. No.: 918,285

[22] Filed: Oct. 10, 1986

[30] Foreign Application Priority Data

Oct. 11, 1985 [DE] Fed. Rep. of Germany ....... 3536290

[51] Int. Cl.⁴ .......................... H02N 6/00; B64G 1/44
[52] U.S. Cl. .................................... 244/173; 136/245; 136/246; 136/292
[58] Field of Search ....................... 136/245, 246, 292; 244/173

[56] References Cited

U.S. PATENT DOCUMENTS

| | | | |
|---|---|---|---|
| 3,419,434 | 12/1968 | Colehower | 136/246 |
| 3,525,483 | 8/1970 | Van Alstyne | 244/173 |
| 4,153,474 | 5/1979 | Rex | 136/246 |
| 4,316,448 | 2/1982 | Dodge | 126/424 |
| 4,555,585 | 11/1985 | Behrens et al. | 136/245 |
| 4,630,791 | 12/1986 | Chapman | 244/173 |

OTHER PUBLICATIONS

R. V. Elms, Jr., Conference Record, 13th IEEE Photovoltaic Specialists Conf. (1978), pp. 208–214.

Primary Examiner—Aaron Weisstuch
Attorney, Agent, or Firm—Ralf H. Siegemund

[57] ABSTRACT

A solar energy collector arrangement is comprised of a plurality of parallely arranged strip-like mirrors, preferably made of aluminum with a silver layer on a concavely curved surface and solar cells being arranged on the rear convexly curved surface, upon which the mirror next to the first mentioned one concentrates solar radiation. These mirror strips are suspended by means of cable inbetween two bars so as to change the orientation of them vis-a-vis the sun; the bars, in turn, are preferably pivotably connected to a telescopic mast, there being additionally guide cable for gathering the individual mirrors. The entire arrangement can be pulled together by pulling all mirrors in juxtaposed position and pivoting the transverse bars against the telescopic mast.

9 Claims, 7 Drawing Figures

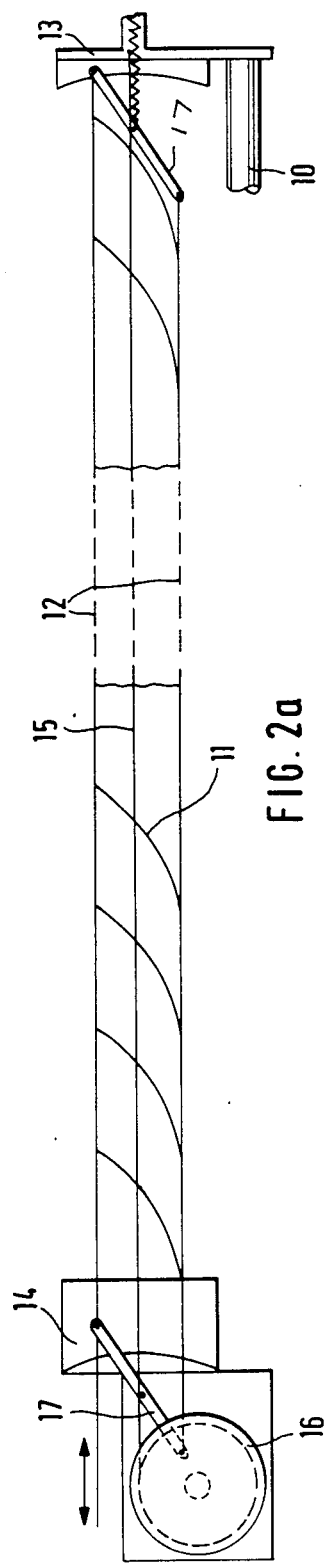
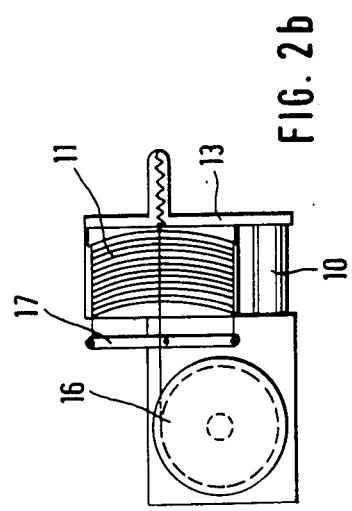
FIG. 2a
FIG. 2b

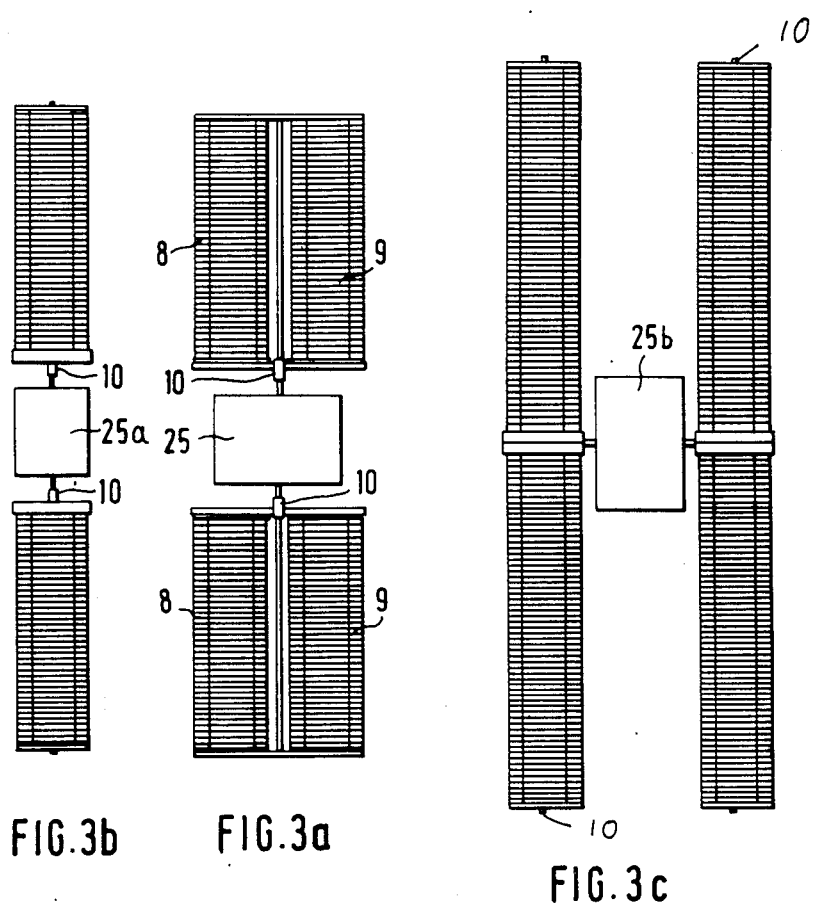

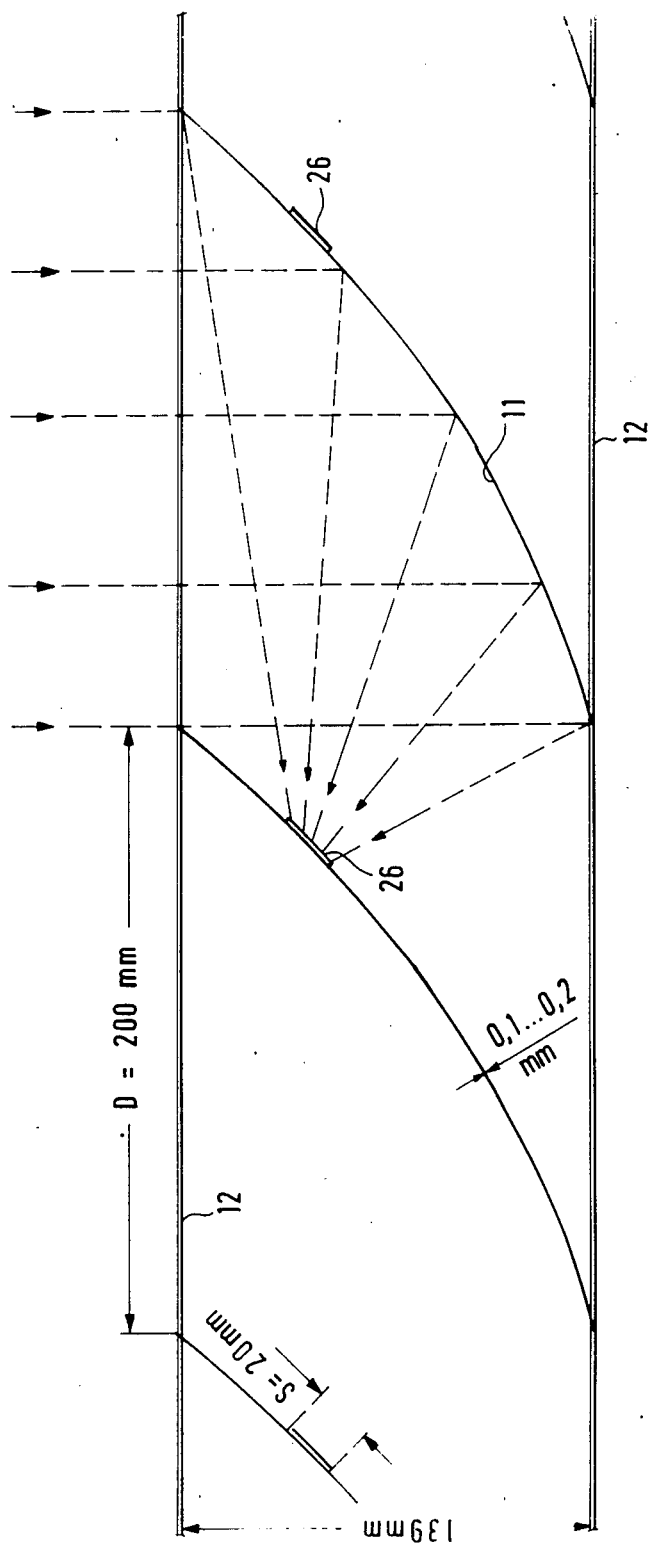

SOLAR ENERGY COLLECTOR

BACKGROUND OF THE INVENTION

The present invention relates to a collector of solar energy for converting such solar energy into electrical energy, and including a plurality of strip-like mirrors arranged so as to direct radiation towards the rear of the next mirror, which rear carries solar cells.

A solar energy collector of the type to which the invention pertains is, for example, disclosed in German Pat. No. 25 57 296. The striplike mirrors of this collector have a parabolic curvature so that a near focal line kind of concentration of the radiation is produced on solar cells carried by the rear side of the mirror strip next to the first one. This way, it is possible, to convert solar radiation into electrical energy very efficiently. The rear of striplike mirrors act also as radiators in the sense that, in fact, the solar cells remain sufficiently cool in spite of the concentration of radiation on them. Hence, the efficiency is not reduced on account of undue heating. This arrangement makes it possible to extract a significant amount of electrical power from solar radiation while utilizing a smaller number of solar cells than was heretofore possible. Efficiency, in turn, reduces to a considerable extent the weight per unit power obtained.

Weight reduction is a particularly important aspect for so-called solar panels as they are used in space stations. On the other hand, it is an undesirable feature that the volume of such a solar energy collector is relatively large bearing in mind that surface area is the critical parameter and not volume for capturing solar energy. Unduly large volume requirement, in turn, means that the relatively expensive useful space in a space station is, in fact, reduced. Moreover, it is a disadvantage that the strip-like mirrors are adjustable only in conjunction with a panel adjustment for purposes of maintaining the arrangement in an efficient and desirable orientation towards the incoming radiation.

DESCRIPTION OF THE INVENTION

It is an object of the present invention to provide a new and improved solar energy collector which particularly, for purposes of transport, can be folded together for purposes of occupying only a very small volume.

It is another object of the present invention to provide solar energy collectors of the type to which the invention pertains and, in particular, by using strip-like mirrors but rendering them adjustable independently from the orientation of the solar panel as a whole.

In accordance with the preferred embodiment of the present invention, it is suggested to provide the strip-shaped mirrors with four carrying cables or ropes and to suspend, in fact, the strip-like mirrors by means of these ropes or cables between two transverse beams or bars for pivoting the mirror strips individually on longitudinal axes, but in unison as to all strips of the assembly. In addition, two control ropes or cables are provided for gathering the mirrors upon retraction. This unit and particularly the transverse bars are connected to, possibly hinged to, a retractable telescopic mast. The sets of cable are separately operated.

The inventive arrangement permits the construction of a solar energy collector which can, in fact, be folded down, whereby the separate adjustment of the strip-like mirrors establishes the desirable adjustability independently from the adjustment (orientation) of the panel as a whole. This way one obtains a significantly better use of the available transport space. On the other hand, following deployment and erection of the mirror, its orientation and particularly the orientation of the mirrors, offers a larger degree of versatility. Herein, it is of particular advantage to provide rollers in the transverses for purposes of taking up or unwinding the ropes and, in addition, adjusting levers are provided to directly and immediately obtain the pivoting of the mirrors individually as well as correctively. Moreover, it is of advantage to manufacture the transverses as well as the telescopic mast from fiber re-enforced compound material.

Upon construction of the solar energy collector in accordance with the invention, it is of additional advantage to manufacture the strip-like mirrors from a heat conducting material and for obtaining a parabolic curvature of the effective mirror surfaces. The solar cells, as they are located on the rear side of the respective mirrors, should be connected to the mirrors in heat conductive relationship. This way, one obtains a focal concentration of radiation onto the solar cells without unduly heating them. Moreover, it is reasonable to construct the rear sides of the strip-like mirrors such that they re-radiate as much as possible of that portion of the light rays which is not converted into electrical energy.

The mirrors could be arranged on both sides of the aforementioned telescopic mast to which the control cables are affixed. In any event, it is of advantage to construct the mirrors from aluminum strips having a thickness from 1/10 to 1/5 of a millimeter. The front (concave) sides of these strips are provided with a silver layer carrying a protective layer on top, while the rear sides of the mirrors are anodized.

DESCRIPTION OF THE DRAWINGS

While the specification concludes with claims particularly pointing out and distinctly claiming the subject matter which is regarded as the invention, it is believed that the invention, the objects and features of the invention, and further objects, features, and advantages thereof will be better understood from the following description taken in connection with the accompanying drawings in which:

FIG. 2a illustrates somewhat schematically a deployed solar energy collector in side elevation;

FIG. 2b illustrates the same solar energy collector in a retracted disposition;

FIGS. 3a, 3b, and 3c show, respectively, three different configurations for the construction of solar panels; and FIG. 4 is a somewhat schematic cross-section through a portion of a solar energy collector of the type shown in the preceding figures, the figure is used to better explain certian geometric relations.

Figure 1:
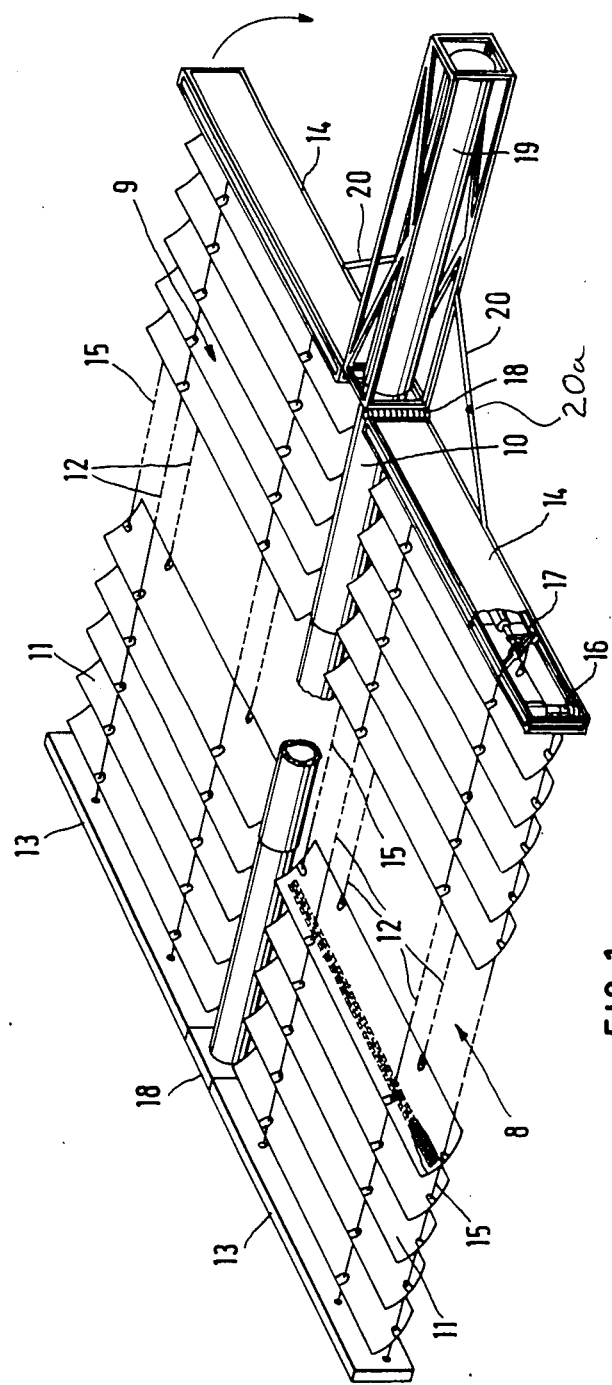
FIG. 1 is a perspective view of a solar panel constructed in accordance with the preferred embodiment of the present invention for practicing the best mode thereof.

Proceeding now to the detailed description of the drawings, reference is first made to FIG. 1 showing a solar panel which is comprised of two solar collecting units 8 and 9 arranged on both sides of a telescopic mast 10. The solar energy collectors 8 and 9 each are comprised of a plurality of strip-like mirrors 11 whqh in each instance are suspended by means of four carrier ropes or cables 12 in between two transverse beams or bars 13 and 14. The cables 12 are arranged in pairs, and are affixed to longitudinal sides of each of the mirrors 11 in a manner illustrated, i.e. two on the top and two on the bottom of each respective strip. In addition, two control ropes or cables 15 are provided for each of the collector units and these ropes or cables 15 are connected to the middle of the short sides or ends of the mirrors. These control ropes likewise terminate at the transverse bars 13 and 14.

As shown now specifically in FIGS. 1, 2a, and 2b, levers 17 are provided on the transverses by means of which the mirrors can be adjusted in unison vis-a-vis the incident solar radiation. As the levers 17 pivot, so will the mirrors about their respective longitudinal axes. Rollers 16 for cables 15 permit deployment as well as retraction or, better, contraction of the solar energy collector. FIG. 2a shows the deployed or extended disposition; rollers (or spools) 16 having played out the cable 15 and FIG. 2b shows the retracted or compacted position of these units, spools 16 having taken up most of the cable 15, to thereby gather all the mirrors together. The gathering proper is effected by the telescopic mast as all its tubes are pulled into outer tube 19 of the mast.

FIG. 1 further illustrates that the transverses 13 and 14 are provided with hinges 18 for connecting them to the telescopic mast 10 (e.g. the structure or tube 1a) so that particularly in the retracted position, the gathered mirrors of the thus compacted solar energy collectors units 8 and 9 can be folded towards the telescopic mast 10, particularly the outer tube 19 thereof, and fastened thereto by means of connecting elements. Struts 20 with a middle hinge 20a each stiffen the transverses 17 when folded out as shown in FIG. 1. The entire solar panel when folded down and contracted occupies a very limited space only and extends basically alongside the telescopic mast which is also being telescoped and retracted in the tube 19. This fold-down and retracted position of the entire arrangement occupies very limited space as compared with the fully deployed and extended position as shown in FIG. 1.

The inventive solar energy collecting units can be arranged in various ways and assembled to obtain larger solar panels. For example, FIG. 3a shows a satellite 25 with two solar panels, each of them corresponding to the solar panel shown in FIG. 1 and being composed of two units, 8 and 9. FIG. 3b shows a different satellite 25a and only one solar energy collector is arranged on each of its two sides so that each solar panel has but one collector unit. Also in this case, the telescopic mast 10 extends in and along the middle and the underside of all the mirror strips. After the retracted mast 10 has gathered all the mirrors no further folding is necessary.

FIG. 3c shows a satellite 25b with two solar panels each of which is comprised of two solar energy collector units 8 and 9 but arranged end to end rather than side by side. The masts are also here arranged along midpoints just as in FIG. 3b. The transverses 13 and 14, in this case, as well as the telescopic mast 10, are made of fiber-reinforced compound material.

As shown specifically in FIG. 4, the incident radiation is reflected and concentrated by means of the parabolically curved front faces of the mirrors in each instance, and the radiation is focussed and concentrated onto the particular solar cells 26 disposed on the rear side of the mirror next to the one whose radiation concentration is presently considered. The strip-like mirrors are in each instance made from aluminum strip being between 0.1 and 0.2 millimeter thick and carry on their mirrored front sides a silver layer which, in turn, is covered by a suitable transparent coating. The coating should preferably be alumina, $Al_2O_3$. Moreover, it is of advantage to anodize the rear sides of the mirrors and to connect the solar cells 26 in heat conductive relationship to the particular mirror 11 on the front side. This way, it is made sure that the solar cells will not be heated by the radiation to an undue extent so that the portion of the solar energy which is not converted into electrical energy is to a considerable extent radiated away from the mirrors' rear sides, in fact, towards the front sides of the respective mirror next to them to obtain some re-radiation and supplemental conversion.

The construction of the solar energy collector in accordance with the invention offers the advantage of being of light weight. Thus the collector can readily be used in outer space, i.e. on satellites as illustrated and described. Even at lower altitude the advantage is offered that any residual air will be permitted to pass along. Thus the panel does not block any air, which means that the molecular resistance of the solar energy collectior, particularly in its initial phases of a launch, is insignificant.

The invention is not limited to the embodiments described above, but all changes and modifications thereof not constituting departures from the spirit and scope of the invention, are intended to be included.

We claim:

1. Solar energy collector, including a plurality of parallely arranged strip-like curved mirrors, each having on its respective concavely curved front side a reflective surface and having solar cells on the surface of its respective convexly curved rear side, upon which solar cells of another of said mirrors concentrates solar radiation, the improvement comprising:
   a telescopic mast;
   frame means including two transverse bars connected to said mast, said mirrors being arranged between said bars;
   a plurality of cables for suspending said mirrors in said parallel arrangement between said bars, for pivoting them equally so as to change their orientation vis-a-vis a source of radiation;
   operating means connected to said cables for obtaining controlling adjustment; and
   two control cables connected to said mirrors for purposes of their retraction as the mast is retracted.

2. The improvement as in claim 1, including rollers connected to the control cables for take up and unwinding upon retracting and deployment, respectively, of the mirrors by the telescopic mast.

3. The improvement as in claim 1, said operating means includes an adjustment lever means connected to said plurality of cables for adjusting the orientation of said mirrors.

4. The improvement as in claim 1, said transverse bars being hinged to the telescopic mast.

5. The improvement as in claim 1, said transverse bars and said mast being made of fiber-reinforced compound material.

6. The improvement as in claim 1, said mirrors being made of and including a heat conductive material interposed between said reflecting surface and said solar cells.

7. The improvement as in claim 1, wherein said mirrors are made of aluminum strip having a thickness between 0.1 and 0.2 millimeter, said reflecting surface being comprised of a silver layer covered by a transparent protective layer, the rear surface of the aluminum strip being anodized.

8. The improvement as in claim 1, including two of said arrangements of transverse bars and mirrors arranged on opposite sides of said mast.

9. The improvement as in claim 1, and including two said arrangements of transverse bars and mirrors extending from opposite sides of a space vehicle.

* * * * *